United States Patent
Guzik et al.

Patent Number: 6,104,119
Date of Patent: Aug. 15, 2000

[54] PIEZOELECTRIC SWITCH

[75] Inventors: Andrzej T. Guzik; Rudy Yorio, both of Pompano Beach; William Boone Mullen, III, Boca Raton; Adolph C. Naujoks, Hallandale, all of Fla.

[73] Assignee: Motorola, Inc., Schaumburg, Ill.

[21] Appl. No.: 09/335,989

[22] Filed: Jun. 18, 1999

Related U.S. Application Data

[62] Division of application No. 09/036,554, Mar. 6, 1998, abandoned.

[51] Int. Cl.$^7$ ..................................................... H01L 41/08
[52] U.S. Cl. ............................................ 310/311; 310/331
[58] Field of Search ..................... 310/311, 331, 310/332

[56] References Cited

U.S. PATENT DOCUMENTS

| | | | |
|---|---|---|---|
| 4,234,813 | 11/1980 | Iguchi et al. | 310/339 |
| 4,383,195 | 5/1983 | Kolm et al. | 310/330 |
| 4,598,592 | 7/1986 | McMaster | 73/786 |
| 4,612,472 | 9/1986 | Kakizaki et al. | 310/339 |
| 5,280,751 | 1/1994 | Muirhead et al. | 102/210 |
| 5,760,530 | 6/1998 | Kolesar | 310/339 |
| 5,861,702 | 1/1999 | Bishop et al. | 310/330 |
| 5,874,892 | 2/1999 | Antonellis et al. | 340/438 |
| 5,883,575 | 3/1999 | Ruby et al. | 340/572.5 |
| 5,923,318 | 2/1999 | Zhai et al. | 345/157 |

FOREIGN PATENT DOCUMENTS

| | | | |
|---|---|---|---|
| 59-229953 | 12/1984 | Japan | H02K 11/00 |
| 3-45145 | 2/1991 | Japan | H02K 11/00 |
| 81/02223 | 8/1981 | WIPO | H01L 41/08 |
| WO 81/02223 | 8/1981 | WIPO | 310/339 |

OTHER PUBLICATIONS

Definition of Piezo Film Polarity, Application Note 65773 Feb. 1, 1994 Rev. B, AMP, Inc. Valley Forge, PA.

*Primary Examiner*—Thomas M. Dougherty
*Attorney, Agent, or Firm*—Dale W. Dorinski

[57] ABSTRACT

A piezoelectric switch (10) is made by laminating one piezoelectric film (16) on the top and a second piezoelectric film (18) on the bottom sides of a stiff central core (14). The central core has one or more actuation areas or poppels (12) formed therein. Each piezoelectric film has an electrically conductive portion (15, 17) formed directly over the actuating area. When the actuating area on the laminate is depressed (11), the piezoelectric films each generate an electric signal that is sent through the electrically conductive portions, thus creating a switching signal.

1 Claim, 2 Drawing Sheets

PIEZOELECTRIC SWITCH

This application is a division of application Ser. No. 09/036,554, filed Mar. 6, 1998, abandoned.

TECHNICAL FIELD

This invention relates generally to switches, and more particularly to piezoelectric switches.

BACKGROUND

Piezoelectricity, Greek for "pressure" electricity, was discovered by the Curie brothers more than 100 years ago. They found that quartz changed its dimensions when subjected to an electrical field, and conversely, generated electrical charge when mechanically deformed. One of the first practical applications of piezoelectricity was in the 1920's by Langevin, who developed a quartz transmitter and receiver for underwater sound—the first SONAR. Before World War II, researchers discovered that certain ceramic materials could be made piezoelectric when subjected to a high polarizing voltage, a process analogous to magnetizing a ferrous material. In 1969, Kawai found very high piezoactivity in the polarized fluoropolymer, polyvinylidene fluoride (PVDF). While other materials, like nylon and polyvinyl chloride (PVC) exhibit the effect, none are as highly piezoelectric as PVDF and its copolymers. Like some other ferroelectric materials, PVDF is also highly pyroelectric, producing electrical charge in response to a change in temperature.

Transducer materials convert one form of energy into another, and are widely used in sensing applications. The tremendous growth in the use of microprocessors has propelled the demand for sensors in diverse applications. Piezoelectric polymer sensors are among the fastest growing technologies within the $18 billion worldwide sensor market. In the years since the discovery of piezoelectric polymer, the technology has matured, and numerous practical applications have emerged and been commercialized.

The reliability of conventional mechanical contact switches is reduced due to contaminates like moisture and dust which foul the contact points. Piezo film is a monolithic structure, thus is not susceptible to this failure mode. One demanding switch application is in a pinball machine that uses a piezo film switch constructed from a laminated piezo film on a spring steel beam, mounted as a cantilever to the end of a circuit board. In response to a direct contact force, the piezo film beam momentarily triggers a MOSFET. This provides a momentary "closure" for up to a 50 V maximum voltage. This piezo film switch does not exhibit the corrosion, pitting or bounce that are normally associated with contact switches, and has been tested in excess of 10 million cycles without failure.

However, all these prior art innovations still have not created a switch that is extremely small and simple. Switches in electronic applications are present in millions of applications, and the need for a small, low profile, low cost switch still exists, unfulfilled.

DETAILED DESCRIPTION OF THE PREFERRED EMBODIMENT

A piezoelectric switch is made by laminating one piezoelectric film on the top and a second piezoelectric film on the bottom sides of a stiff central core. The central core has one or more actuation areas or poppels formed therein. Each piezoelectric film has an electrically conductive portion formed directly over the actuating area. When the actuating area on the laminate is depressed, the piezoelectric films each generate an electric signal that is sent through the electrically conductive portions, thus creating a switching signal.

For purposes of discussion, we will use the term "piezo film" to mean a sheet or film of a piezoelectric polymer such as PVDF and/or PVDF copolymers. Piezo films are flexible, lightweight, tough plastic films available in a wide variety of thicknesses and area sizes. Its properties as a transducer include:

Wide frequency range—0.001 Hz to $10^9$ Hz.

Vast dynamic range ($10^{-8}$ to $10^6$ psi).

Low acoustic impedance

High elastic compliance

High voltage output—10 times higher than piezo ceramics for the same force input.

High dielectric strength—withstanding strong fields (75 V/$\mu$m) where most piezoceramics depolarize.

High mechanical strength and impact resistance ($10^9$–$10^{10}$ Pascal modulus).

High stability—resisting moisture (<0.02% moisture absorption), most chemicals, oxidants, and intense ultraviolet and nuclear radiation.

Piezo film does have some limitations for certain applications. It makes a relatively weak electromechanical transmitter when compared to ceramics, particularly at resonance and in low frequency applications. The newer copolymers of PVDF permit use at higher temperatures (135° C.) and can be formed in unique shapes, such as cylinders and hemispheres. Also, if conductors on the film are exposed, the sensor can be sensitive to electromagnetic radiation, and thus may require shielding for high EMI/RFI environments. Although PVDF film is thin, flexible, and has low density, it is mechanically tough. The compliance of piezo film is 10 times greater than the compliance of ceramics. When extruded into a thin sheet, piezoelectric polymers can be directly attached to a structure without disturbing its mechanical motion. Piezo film is well suited to strain sensing applications requiring very wide bandwidth and high sensitivity. As an actuator, the polymer's low acoustic impedance permits the efficient transfer of energy into air and other gases.

Figure 2:
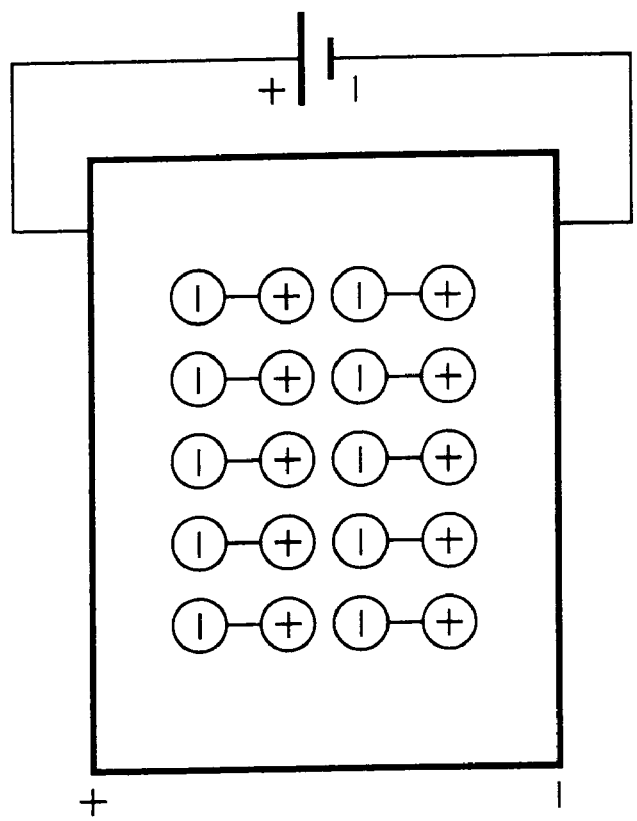
FIGS. 1 and 2 are schematic representations of the poling process for a piezoelectric polymer film.
Figure 1:
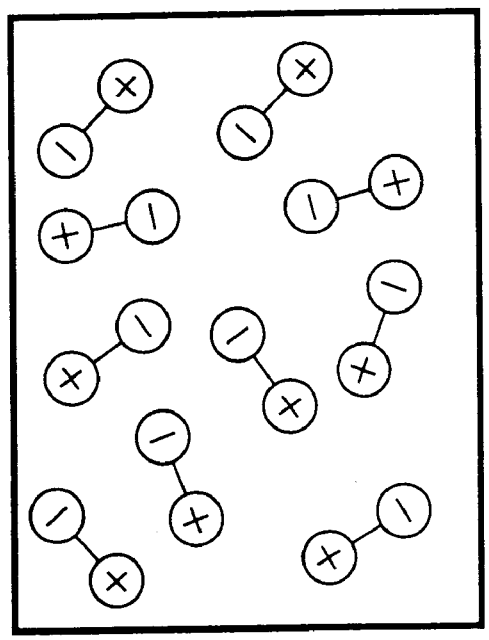

Piezoelectric PVDF film is electrically polarized. Unpoled piezo film is a polymer comprised of many randomly oriented hydrogen (+) and fluorine (−) dipoles as seen in FIG. 1. The polarization process is used to align the dipoles in an electric field such that a net dipole moment is permanently imparted. FIG. 2 shows the effect of applying a high DC poling field to the surface of a piezo polymer film. It is the polarity of the applied poling voltage which determines the resulting polarity (alignment) of the piezo film's dipole moment. It should be noted that it is the polarity of the applied poling voltage which serves as the standard reference for electrical polarity of the polymer film. From FIGS. 1 and 2 it can be seen that during polarization, the positive hydrogen atoms are attracted to the negating poling electrode, while the negative fluorine atoms are attracted to the positive poling electrode. After the poling process is completed, a dipole alignment of this same polarity remains intact. The interaction of the remnant dipole moment with time-varying mechanical stimuli produces the piezoelectric effect.

Figure 3:
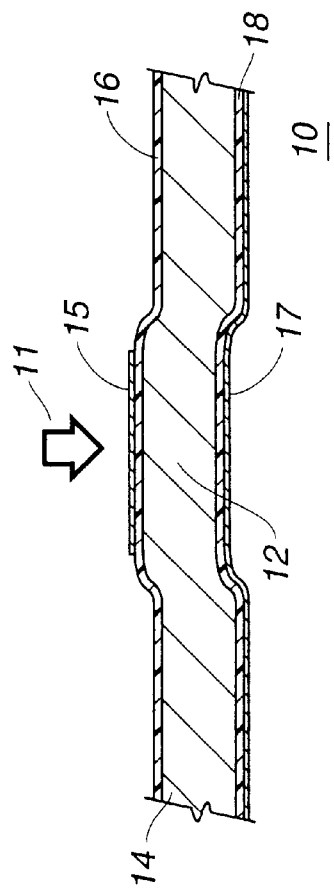
FIG. 3 is cross-sectional view of a piezoelectric switch in accordance with our invention.
Figure 5:
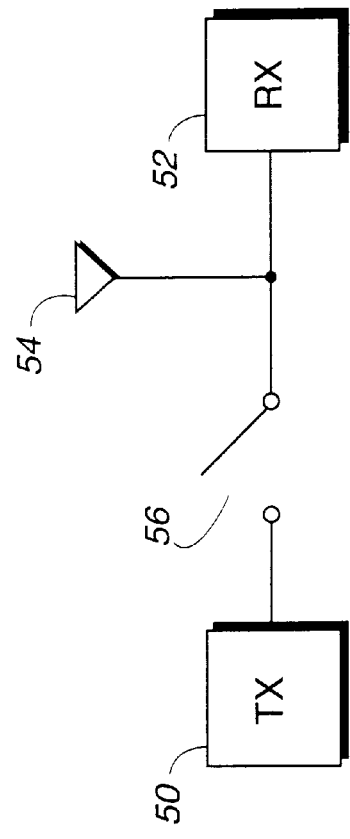
FIG. 5 is a schematic diagram of a two way radio in accordance with the invention.

One embodiment of our invention is a keypad switch assembly. Keypads are well known electrical switching devices and are available in a wide variety of designs. The following discussion assumes that the reader is skilled in the art of keypads, and thus will readily understand the construction with ready reference to the drawing figures. Although keypads usually have more than one switch contained therein, it should be understood that the following structure can also be used to make a keypad containing but a single switch. Referring now to FIG. 3, a preferred embodiment of a cross section of a piezoelectric keypad switch 10 consists of three mechanical elements: an actuator 12 (a poppel formed on a sheet of metal such as stainless steel or other stiff metal) having a piezo polymer film laminated on both sides. Beginning in the center of the laminate, an array of small domes, poppels or other push button shapes serves as actuating areas 12 for the switch. The domes are formed (for example, by stamping) in a sheet of stiff material. This sheet of stiff material serves as the central core 14 of the switch. Although we refer to these shapes as domes, poppels or other push button shapes, they can take a variety of shapes and configurations and still fall with the scope of our invention. For example, they may be a tongue formed in the sheet, with a peripheral portion excised to allow the tongue to move. Our preferred embodiment utilizes a thin sheet of stainless steel as the stiff material, but a wide variety of materials can be employed, as long as they are suitably stiff, i.e. stiff enough so that the dome will deflect when depressed with sufficient force, and then pop back into the original shape after the force is released. The actuation area 12 or poppel that carries the piezo film can be suitably modified to adjust switch sensitivity for high to low impact forces.

The central core sheet containing the domes is then laminated with piezo film 16,18 on both sides, so that the film at least covers the actuating areas 12. Although it is most convenient to simply cover the entire surface with the piezo films, if desired, only portions of the stiff central core can be covered, as long as the actuating areas 12 are covered with piezo film. The laminated piezo polymer film contains electrically conductive portions 15, 17 on both sides of the dome. These electrically conductive portions 15, 17 are typically metal that is selectively applied on portions of the piezo film surface, but can be other types of conductive traces, for example, graphite filled ink, conductive epoxy, etc. The piezo films are designed (polarized) to provide a positive electrical impulse from the top film 16 and a negative electrical impulse from the film 18 on the bottom side of the central core 14 when the actuating area 12 is deformed. This design produces a positive output from the top and bottom piezoelectric films when the dome is compressed in the direction of the arrow 11, and a negative signal when the dome is released and returns to the original position. Like water from a sponge, piezoelectric materials generate charge when squeezed. The strength of the signal is directly proportional to the mechanical deformation of the piezoelectric material. Piezo film, like all piezoelectric materials, is a dynamic material that develops an electrical charge proportional to a change in mechanical stress. The deformation of each of the two films causes a change in the surface charge density of the piezo film so that a voltage appears at the surface. When the force is reversed, the output voltage is of opposite polarity.

Figure 4:
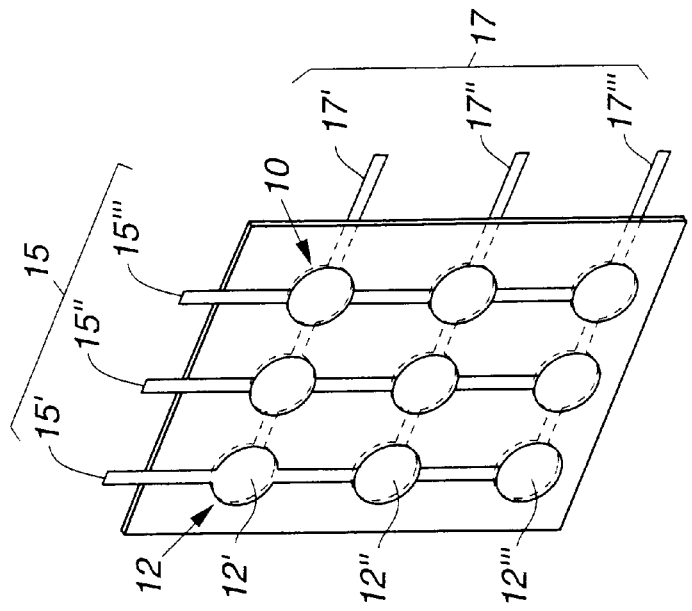
FIG. 4 is an isometric view of a piezoelectric keypad assembly in accordance with our invention.

These voltages or electrical signals are carried away by the electrically conductive portions 15, 17 that overlies the actuation area. Since the metallization is in direct and intimate contact with each of the respective piezo films 16, 18, the electrical signal can easily be routed to an appropriate destination. Referring now to FIG. 4, a perspective view of the keypad assembly instantly described and shown in cross-section in FIG. 3, the electrically conductive portions 15, 17 are preferably situated as parallel conductive circuit traces or runners that are orthogonal to each other, with one set formed on the top side and another set formed on the bottom side. The two sets of electrically conductive portions 15, 17 intersect at each of the actuation areas 12, so that each area 12', 12", 12''', etc. provides a signal to a unique pair of conductors. For example, depressing actuation area 12' creates an electrical signal in conductors 15' and 17', whereas depressing actuation area 12" creates an electrical signal in conductors 15' and 17". Thus, the two piezo films create a uniquely coded signal for each actuation area.

Piezoelectric materials are not suitable for static measurements (true dc) because the electrical charges developed by piezo film decay with a time constant that is determined by the dielectric constant and the internal resistance of the film, as well as the input impedance of the interface electronics to which the film is connected. However, they are quite suitable for transient signaling when suitable modifications are provided. Piezo film in combination with the snap dome provides a high voltage pulse. When the snap dome actuates, the film is rapidly strained, typically generating a 10 volt pulse into a high resistance circuit. This concept is especially well suited for wakeup switches, where an electronic device can be dormant for long periods without power consumption. When the switch is actuated, the piezoelectric pulse turns on the electronics. A push-to-talk (PTT) switch in a two-way radio, where battery life is very critical, is one example of a piezo snap action switch application.

The radio contains a transmitter 50, a receiver 52 and an antenna 54, and the PTT 56 switch is coupled to the radio transmitter. When the PTT switch is actuated, the radio transmits. Upon release of the switch, the transmit terminates. Prior art PTT switches are all mechanical, and prone to contact failure by contamination and wear out. Further, they required that electrical power be run from the battery through the switch and then to the transmitter, consuming precious battery resources. By creating a PTT switch using our novel approach, contact failure is eliminated (there are no contacts) and no battery power is required. Additional interface of the piezoelectric elements to a PC board may be easily accomplished with a direct connection, without the need for additional elements, such as flex cables or sockets. The absence of these additional circuit components greatly simplifies the interconnect method and thus reduces the cost of the entire switch assembly.

In summary, the operation of our piezo film switch is as follows: When pressure is applied to the actuator, the dome collapses causing the piezoelectric films to be bent. This mechanical stress of the film produces a positive electrical impulse in the film on both sides of the metal substrate. The domes of a keypad array are typically connected in a matrix of upper and lower metallized conductors. The conductors provide electrodes for accumulating the electrical energy in response to the temporary mechanical deformation caused by the deformation of the dome. A voltage impulse is transmitted through each of the metallized conductors to create a coded signal to a suitable signal processing circuit, such as a microprocessor. The microprocessor then identifies the specific key that has been actuated based on the identity of the conductors, and executes the desired command.

When the dome collapses, both of the piezo polymer films generate a positive impulse. Upon release of the switch, however, the polymer piezo films create a negative impulse of equal amplitude. Although this negative impulse may be ignored for conventional keypad switching operations, applications that need to determine the length of time that the switch is actuated can use this to advantage. For example, in a push-to-talk (PTT) switch in a two-way radio, the positive impulse can be used to turn on the transmitter while the negative impulse created at the release of the switch can be used to terminate the radio transmit function.

Our switch does not require an external power source, so the radio is safe from spark hazard. Our piezoelectric switch solves the nagging problem of fouled contacts, a significant source for equipment downtime in electronic applications. The simplicity of the design makes it more cost-effective than conventional keypad switches. While the preferred embodiments of the invention have been illustrated and described, it will be clear that the invention is not so limited, and other equivalents will occur to those skilled in the art without departing from the spirit and scope of the present invention as defined by the appended claims.

What is claimed is:

1. A two-way radio having a piezoelectric push-to-talk (PTT) switch, comprising:

a transmitter, a receiver and an antenna coupled together;

a piezoelectric push-to-talk (PTT) switch coupled to the transmitter, said PTT switch comprising:

a rigid sheet having upper and lower major surfaces and having an actuation portion;

a first piezoelectric film disposed on the upper surface and a second piezoelectric film disposed on the lower surface to form a laminated structure;

a first electrically conductive area on the first piezoelectric film and a second electrically conductive area on the second piezoelectric film, each of the electrically conductive areas overlying the actuation portion; and said laminated structure and first and second electrically conductive areas co-operating when the actuation portion is sufficiently deformed to cause the first and second piezoelectric films to each generate electric signals that are sent through the first and second electrically conductive areas; and said generated electric signals causing said transmitter to transmit a radio signal through said antenna.

* * * * *